United States Patent
Ni

(10) Patent No.: US 9,467,101 B2
(45) Date of Patent: Oct. 11, 2016

(54) SYSTEMS, CIRCUITS AND METHODS RELATED TO MULTI-MODE POWER AMPLIFIERS HAVING IMPROVED LINEARITY

(71) Applicant: SKYWORKS SOLUTIONS, INC., Woburn, MA (US)

(72) Inventor: Jianxing Ni, San Jose, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/531,966

(22) Filed: Nov. 3, 2014

(65) Prior Publication Data

US 2015/0162877 A1 Jun. 11, 2015

Related U.S. Application Data

(60) Provisional application No. 61/901,057, filed on Nov. 7, 2013.

(51) Int. Cl.

| H03F 1/02 | (2006.01) |
|---|---|
| H03F 3/19 | (2006.01) |
| H03F 3/21 | (2006.01) |
| H01L 23/66 | (2006.01) |
| H03F 1/32 | (2006.01) |
| H03F 3/195 | (2006.01) |

(52) U.S. Cl.
CPC ............... *H03F 3/19* (2013.01); *H01L 23/66* (2013.01); *H03F 1/0261* (2013.01); *H03F 1/32* (2013.01); *H03F 3/195* (2013.01); *H03F 3/21* (2013.01); *H01L 2223/665* (2013.01); *H01L 2223/6655* (2013.01); *H01L 2224/05554* (2013.01); *H01L 2224/48227* (2013.01); *H01L 2924/19105* (2013.01); *H03F 2200/18* (2013.01); *H03F 2200/451* (2013.01)

(58) Field of Classification Search
USPC ................................ 330/285, 296, 277, 310
See application file for complete search history.

(56) References Cited

U.S. PATENT DOCUMENTS

| 6,882,227 B2* | 4/2005 | Barry | H03F 1/0261 330/285 |
| 7,834,700 B2* | 11/2010 | Inamori | H03F 1/0261 330/124 R |

* cited by examiner

*Primary Examiner* — Hieu Nguyen
(74) *Attorney, Agent, or Firm* — Chang & Hale LLP

(57) ABSTRACT

Multi-mode power amplifiers (PAs) having improved linearity. A PA can include an amplifying bipolar junction transistor (BJT) configured to receive and amplify a radio-frequency (RF) signal. The PA can further include a biasing circuit configured to provide a first bias signal or a second bias signal to the BJT for operation in a first mode or a second mode. Each of the first bias signal and the second bias signal can be routed to the BJT through a path that includes a common node and a ballast. The PA can further include a linearizing circuit implemented between the common node and a node along an input path for the BJT. The linearizing circuit can be configured as a coupling path to improve linearity of the PA operating in the first mode while allowing the ballast to be sufficiently robust for the PA operating in the second mode.

20 Claims, 11 Drawing Sheets

SYSTEMS, CIRCUITS AND METHODS RELATED TO MULTI-MODE POWER AMPLIFIERS HAVING IMPROVED LINEARITY

CROSS-REFERENCE TO RELATED APPLICATION(S)

This application claims priority to U.S. Provisional Application No. 61/901,057 filed Nov. 7, 2013, entitled SYSTEMS, CIRCUITS AND METHODS RELATED TO MULTI-MODE POWER AMPLIFIERS HAVING IMPROVED LINEARITY, the disclosure of which is hereby expressly incorporated by reference herein in its entirety.

BACKGROUND

1. Field

The present disclosure generally relates to multi-mode power amplifiers having improved linearity.

2. Description of the Related Art

In wireless communication applications, size, cost, and performance are examples of factors that can be important for a given product. For example, to reduce both of the cost and product size, wireless components such as multi-mode and multi band power amplifiers are becoming more popular. In an example context of power amplifier (PA) products, some PA devices can be configured to provide dual mode functionalities such as GPRS (general packet radio service) and EDGE (enhanced data rates for GSM evolution) modes.

SUMMARY

In accordance with some implementations, the present disclosure relates to a power-amplifier (PA) including a PA circuit that includes a bipolar junction transistor (BJT) having a base, a collector and an emitter. The BJT is configured to receive a radio-frequency (RF) signal through an input path and amplify the RF signal. The PA further includes a biasing circuit in communication with the PA circuit. The biasing circuit is configured to provide a first bias signal or a second bias signal to the PA circuit for operation in a first mode or a second mode, respectively. Each of the first bias signal and the second bias signal is routed to the BJT through a path that includes a common node and a ballast. The PA further includes a linearizing circuit implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some embodiments, the ballast can include a DC ballasting resistance such as a DC ballasting resistor. In some embodiments, the BJT can include a heterojunction bipolar transistor (HBT) such as a gallium arsenide (GaAs) HBT.

In some embodiments, the BJT can be configured such that the RF signal is received at the base through the input path, and the amplified RF signal is output through the collector. The first mode can include an EDGE (enhanced data rates for GSM evolution) mode, and the second mode can include a GPRS (general packet radio service) mode. The biasing circuit can include a current mirror that generates the first bias signal for the operation of the PA circuit in the EDGE mode. The current mirror can include a BJT coupled to a reference current source, with the first bias signal being output through an emitter of the BJT to be provided to the common node. The ballast can be implemented between the common node and the base of the PA BJT, such that the common node functions as a base-emitter junction between the base of the PA BJT and the emitter of the current mirror BJT. The input path can include a DC blocking capacitance implemented between the base of the PA BJT and a node where the linearizing circuit is connected to. The linearizing circuit can be configured to couple the RF signal between the input path and the base-emitter junction to provide rectification on the base-emitter junction and correct AM-AM distortion and thereby yield the improved linearity.

In some embodiments, the biasing circuit can include a bias resistance implemented between a GPRS bias node and the common node, such that the second bias signal is provided to the gate of the BJT from the GPRS bias node through the bias resistance, the common node, and the ballast.

In some embodiments, the PA circuit can include a second BJT configured to provide another stage of amplification. In some embodiments, the second BJT can be implemented so that the input path of the BJT is coupled to an output of the second BJT. In some embodiments, the second BJT can be configured to receive the amplified RF signal from the BJT.

In some embodiments, the linearizing circuit can include a capacitance such as a capacitor. In some embodiments, the linearizing circuit can further include a resistance such as a resistor connected in series with the capacitance. In some embodiments, the linearizing circuit can further include an inductance such as an inductor connected in series with the capacitance.

In some implementations, the present disclosure relates to a power-amplifier (PA) module (PAM) that includes a packaging substrate configured to receive a plurality of components. The PAM further includes a power amplifier (PA) circuit formed on a die that is mounted on the packaging substrate. The PA circuit includes a bipolar junction transistor (BJT) having a base, a collector and an emitter. The BJT is configured to receive a radio-frequency (RF) signal through an input path and amplify the RF signal. The PAM further includes a biasing circuit in communication with the PA circuit. The biasing circuit is configured to provide a first bias signal or a second bias signal to the PA circuit for operation in a first mode or a second mode, respectively. Each of the first bias signal and the second bias signal is routed to the BJT through a path that includes a common node and a ballast. The PAM further includes a linearizing circuit implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some embodiments, the biasing circuit can be formed on the die. In some embodiments, at least a portion of the linearizing circuit can be formed on the die.

According to some teachings, the present disclosure relates to a wireless device that includes a transceiver configured to process RF signals, an antenna in communication with the transceiver and configured to facilitate transmission of an amplified RF signal. The wireless device further includes a power amplifier (PA) module in communication with the transceiver and configured to generate the amplified RF signal. The PA module includes a power amplifier (PA) circuit that includes a bipolar junction transistor (BJT) having a base, a collector and an emitter. The BJT is configured to receive a radio-frequency (RF) signal through an input path and amplify the RF signal. The PA module further includes a biasing circuit in communication with the PA circuit. The biasing circuit is configured to provide a first bias signal or a second bias signal to the PA circuit for operation in a first mode or a second mode, respectively. Each of the first bias signal and the second bias signal is routed to the BJT through a path that includes a common node and a ballast. The PA module further includes a linearizing circuit implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some implementations, the present disclosure relates to a method for operating a power-amplifier (PA). The method includes receiving a radio-frequency (RF) signal through an input path in a PA circuit that includes a bipolar junction transistor (BJT) having a base, a collector and an emitter. The method further includes providing a first bias signal or a second bias signal to the PA circuit for operation in a first mode or a second mode, respectively. Each of the first bias signal and the second bias signal is routed to the BJT through a path that includes a common node and a ballast. The method further includes coupling the common node and a node along the input path with a linearizing circuit to improve linearity of the PA circuit operating in the first mode while allowing the ballast to be sufficiently robust for the PA circuit operating in the second mode.

According to some implementations, the present disclosure relates to a method for fabricating a power-amplifier (PA) die. The method includes providing a semiconductor substrate, and forming a power amplifier (PA) circuit on the semiconductor substrate. The PA circuit includes a bipolar junction transistor (BJT) having a base, a collector and an emitter, and the PA circuit is configured to receive a radio-frequency (RF) signal through an input path and amplify the RF signal. The method further includes forming a biasing circuit on the semiconductor die. The biasing circuit is configured to provide a first bias signal or a second bias signal to the PA circuit for operation in a first mode or a second mode, respectively. Each of the first bias signal and the second bias signal is routed to the PA circuit through a path that includes a common node and a ballast. The method further includes forming at least a portion of a linearizing circuit on the semiconductor substrate. The linearizing circuit is implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some embodiments, the semiconductor substrate can include gallium arsenide (GaAs). In some embodiments, the BJT can be a heterojunction bipolar transistor (HBT).

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In wireless communication applications, size, cost, and performance are examples of factors that can be important for a given product. For example, to reduce both of the cost and product size, wireless components such as multi-mode and multi band power amplifiers are becoming more popular. In an example context of power amplifier (PA) products, some PA devices can be configured to provide dual mode functionalities such as GPRS (general packet radio service) and EDGE (enhanced data rates for GSM evolution) modes. In some implementations, such dual-mode PA devices can be controlled by, for example, a finger-based integrated power amplifier control (FB-iPAC) control circuit. Examples related to such a control circuit can be found in U.S. Patent Application Publication No. US20140049321 titled SYSTEMS, CIRCUITS AND METHODS RELATED TO CONTROLLERS FOR RADIO-FREQUENCY POWER AMPLIFIERS which is expressly incorporated by reference in its entirety.

In some embodiments, such PA devices can be implemented on an HBT (heterojunction bipolar transistor) die, and can benefit from both lower cost and higher performance. To implement an EDGE biasing network into such a die, it can be desirable to have a DC ballasting resistance (e.g., a resistor) of each HBT finger be shared between the EDGE and GPRS sections of the biasing network. However, such a design can create a challenge.

For example, a portion of the HBT PA die corresponding to the GPRS section typically needs to be robust under extreme conditions, since the PA is driven to higher power in the GPRS mode. Hence, a higher-valued DC ballasting resistor is typically provided for each HBT finger to reduce the thermal positive feedback which can be caused by Vbe and/or operating temperature of the HBT.

On the other hand, for the EDGE mode, AM-AM distortion can be a significant cause of non-linearity. In some situations, a higher-valued DC ballasting resistor can yield such AM-AM distortion, thereby degrading the linearity performance and creating a design challenge. Described herein are various examples of how linearity of a PA (e.g., HBT PA) can be improved while maintaining the desired or required ruggedness. Although described in the context of GPRS and EDGE modes, it will be understood that one or more features of the present disclosure can also be implemented for other operating modes, as well as in other wireless applications. It will also be understood that although various examples are described herein in the context of HBTs, one or more features of the present disclosure can also be implemented for other types of bipolar junction transistors, and other types of amplifying transistors.

Figure 1:
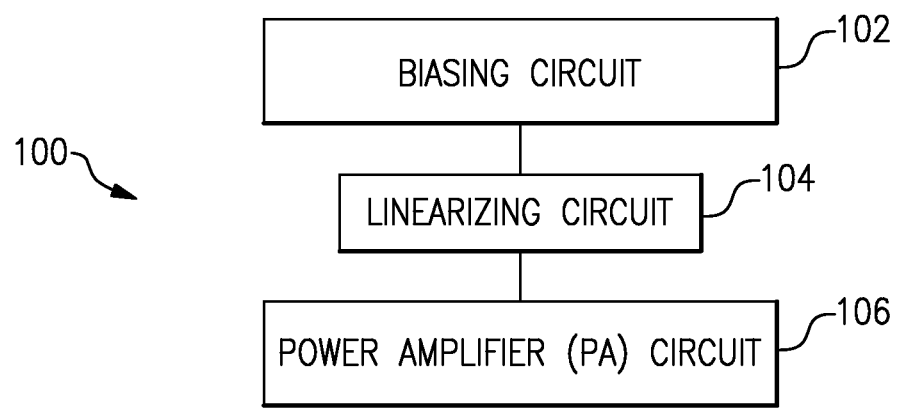
FIG. 1 depicts a power amplifier (PA) being biased with a biasing circuit via a linearizing circuit.

FIG. 1 shows a PA biasing configuration 100 where a PA circuit 106 is being biased by a biasing circuit 102 via or with a linearizing circuit 104. As described herein, the PA biasing configuration 100 can include one or more features that can address some or all of the foregoing challenges.

Figure 2:
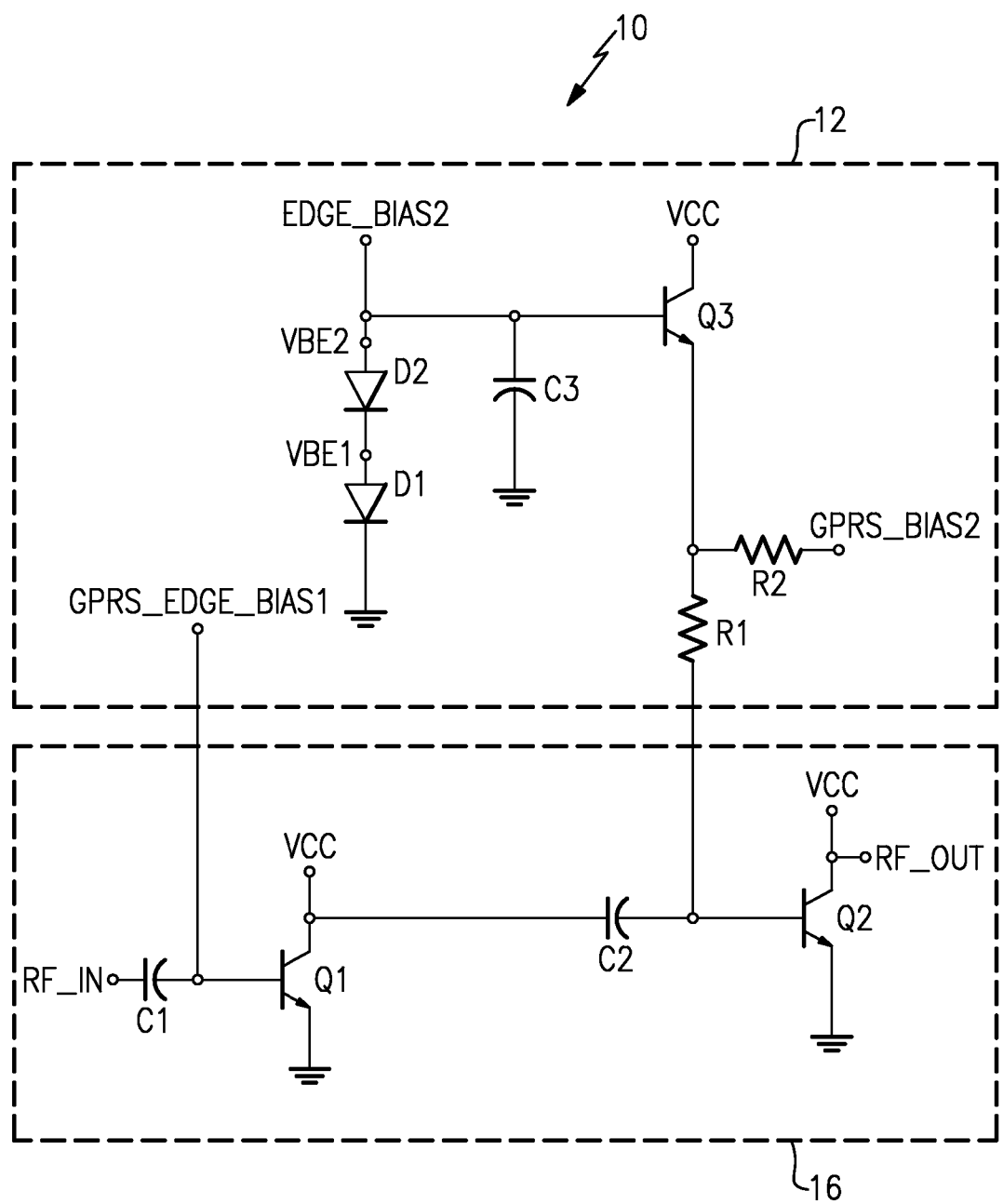
FIG. 2 shows an example PA being provided with bias signals from a biasing circuit.

FIG. 2 shows an example biasing configuration 10 in which a linearizing circuit as described herein can be implemented. The example biasing configuration 10 is shown to include an example PA circuit 16 in communication with an example biasing circuit 12. The example PA circuit 16 is depicted as having an input port RF_IN for receiving an RF signal to be amplified. Such an amplified RF signal can exit the PA circuit 16 through an output port RF_OUT.

In the example PA circuit 16, two stages of amplification are depicted. It will be understood, however, that the number of amplification stages can be more or less than two.

In the example of FIG. 2, the input RF signal received at the input port RF_IN can be provided to the base of the first HBT (Q1) through, for example, a DC blocking capacitance (e.g., capacitor) C1. The input path to the first HBT (Q1) may or may not include an input matching network (not shown).

The RF signal amplified by the first HBT (Q1) can be output through the HBT's collector, and such an output can be provided to the base of the second HBT (Q1) through, for example, a DC blocking capacitance (e.g., capacitor) C2. The path between the first and second HBTs (Q1, Q2) may or may not include an interstage matching network (not shown).

The RF signal amplified by the second HBT (Q2) can be output through the HBT's collector, and such an output can be provided to the output port RF_OUT of the PA circuit 16. The output path from the second HBT (Q2) may or may not include an output matching network (not shown).

In the example of FIG. 2, supply voltage VCC for the first HBT (Q1) can be provided to its collector. Similarly, supply voltage VCC for the second HBT (Q2) can be provided to its collector.

In the example of FIG. 2, a bias signal for the first stage of the PA circuit 16 for both of the GPRS and EDGE modes can be provided to the base of the first HBT (Q1) from a bias node GPRS_EDGE_BIAS1 of the biasing circuit 12. For the second HBT (Q2), a GPRS bias signal can be provided to the base of Q2 from a bias node GPRS_BIAS2 of the biasing circuit 12 through a resistance R2 and a DC ballast resistance R1.

An EDGE bias signal for Q2 can be provided from a current mirror, where a reference current from a bias node EDGE_BIAS2 is mirrored in a supply path that includes a supply node VCC and an HBT (Q3). The mirrored current can be provided to the base of Q2 as a bias voltage by passing through the DC ballast resistance R1.

The example current mirror in the bias circuit 12 is depicted as including diodes D1 and D2 on the reference side. The example current mirror is also depicted as having the base of Q3 coupled to the bias node EDGE_BIAS2. A capacitance C3 is depicted as coupling the foregoing path between EDGE_BIAS2 and Q3 to the ground.

Figure 3:
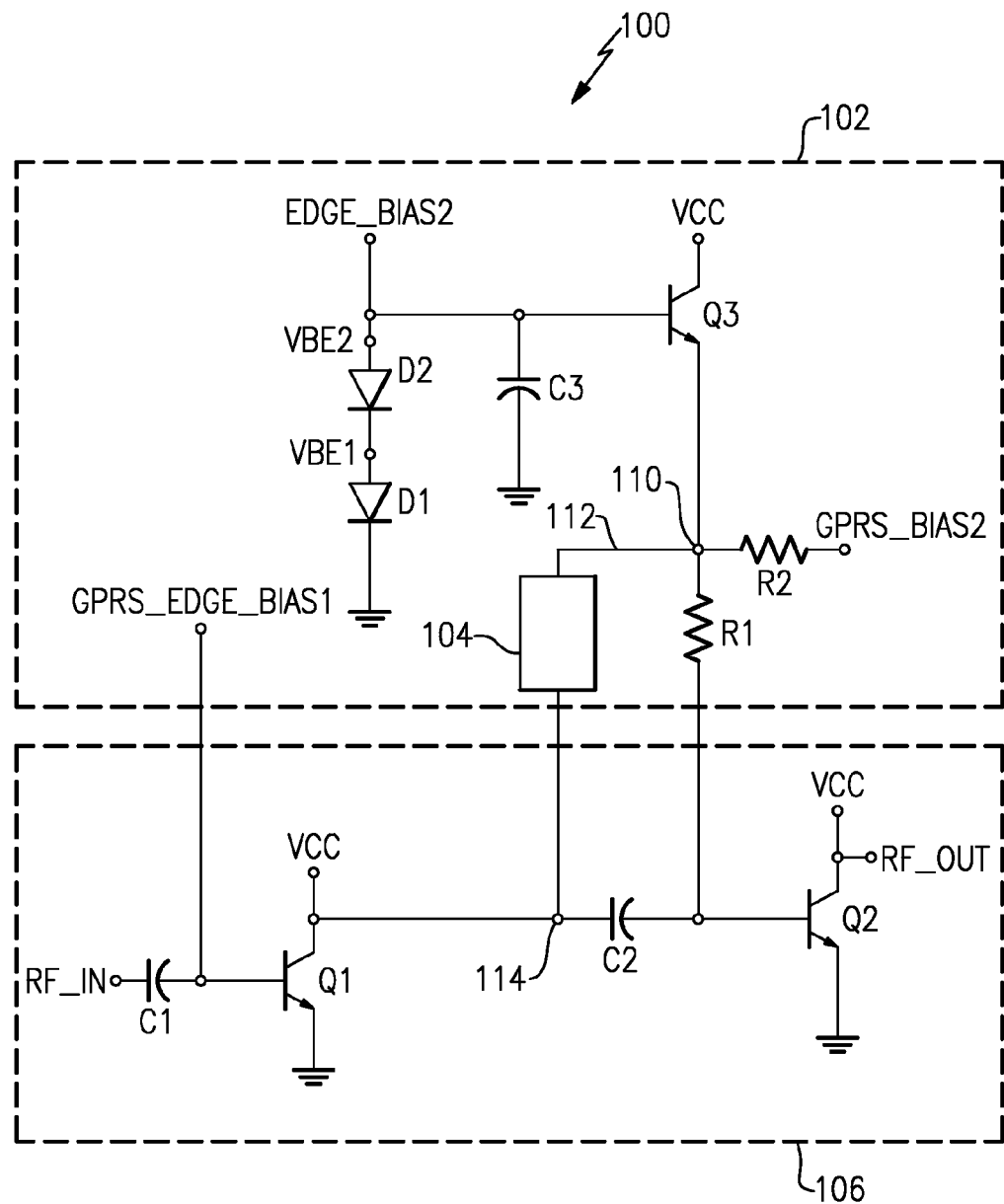
FIG. 3 shows an example where a linearizing circuit having one or more features as described herein can be implemented for the example biasing configuration of FIG. 2.

FIG. 3 shows that in some embodiments, a biasing configuration 100 can be implemented such that a linearizing circuit 104 along a path 112 couples a node 110 (between R1, R2 and the emitter of Q3) with a node 114 (on the input side of the DC block capacitance C2). Various non-limiting examples of the linearizing circuit 104 are described herein in greater detail. In FIG. 3, the current mirror, resistances R1 and R2, and the biasing of Q1 can be configured in a similar manner as the example of FIG. 2.

In the example of FIG. 3, the linearizing circuit 104 is depicted as being part of a biasing circuit 102. However, it will be understood that some or all of the linearizing circuit 104 can be part of the biasing circuit 102, be part of a PA circuit 106, be outside of both of the biasing circuit 102 and the PA circuit 106, or any combination thereof.

In the foregoing biasing configuration (100) of FIG. 3, the DC ballasting resistance R1 can be increased to any value needed or desired for ruggedness to accommodate, for example, the GPRS mode (e.g., GMSK modulation). Such a resistance can be configured to protect the RF array from effects such as thermal runaway. The DC ballasting resistance R1 can operate in conjunction with another resistance (e.g., resistance R2) as a biasing network for the GPRS mode.

In the foregoing biasing configuration (100) of FIG. 3, Q3 can be turned ON to accommodate, for example, the EDGE mode (e.g., GMSK modulation). In such a mode, the EDGE-mode biasing current can pass through the DC ballasting resistance R1 as well. As described herein, the path 112 with the linearizing circuit 104 can provide a coupling path for RF power entering (Q2) (e.g., from the preceding stage (Q1)) to the emitter of Q3. Such a coupling can yield rectification on the base-emitter junction of Q2 and Q3 to thereby correct AM-AM distortion, and hence improve linearity. At the same time, PA robustness can be achieved with the relatively large DC ballasting resistance R1.

Figure 4:
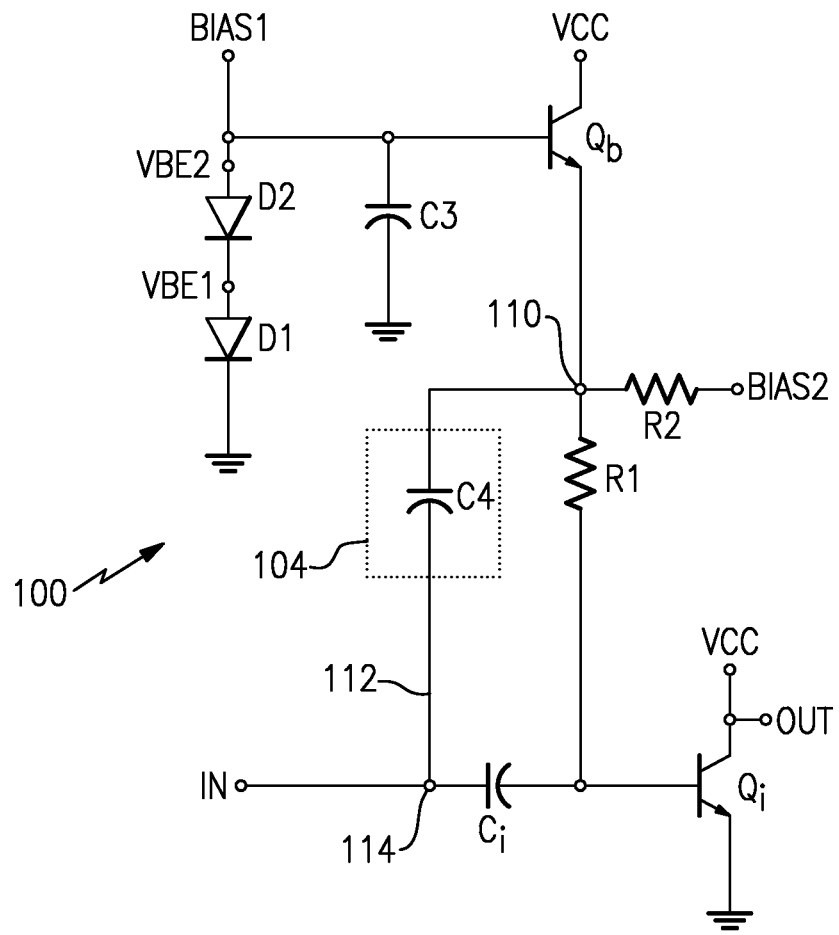
FIG. 4 shows an example of the linearizing circuit.

FIGS. 4-6 show various non-limiting examples of the linearizing circuit 104 described in reference to FIG. 3. As shown in FIGS. 4-6, the linearizing circuit 104 can be implemented on one or more stages of a PA circuit. In some embodiments, the linearizing circuit 104 can be implemented on a given stage of a PA circuit, and such a stage may or may not be preceded or be followed by another stage.

In an example biasing configuration 100 of FIG. 4, the linearizing circuit 104 can include a capacitance C4 (e.g., capacitor) along the path 112 that couples the nodes 110 and 114. Such a capacitance (C4) can provide the rectification functionality on the base-emitter junction of Q and Q3 as described in reference to FIG. 3 (Q2 and Q3) to thereby correct AM-AM distortion, and hence improve linearity.

Figure 5B:
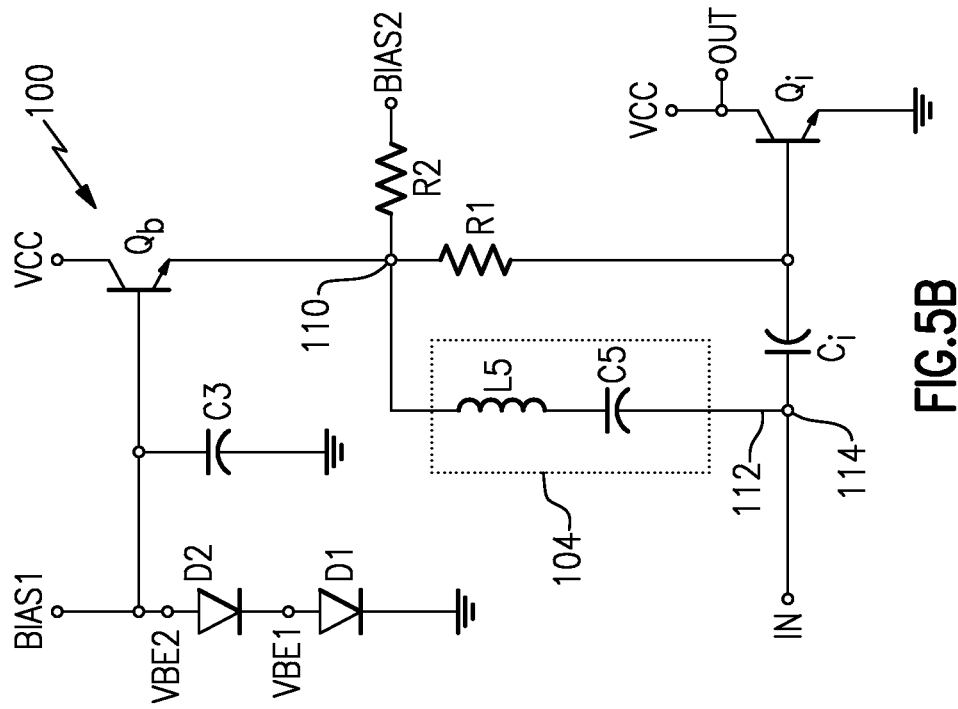
FIGS. 5A and 5B show more examples of the linearizing circuit.
Figure 5A:
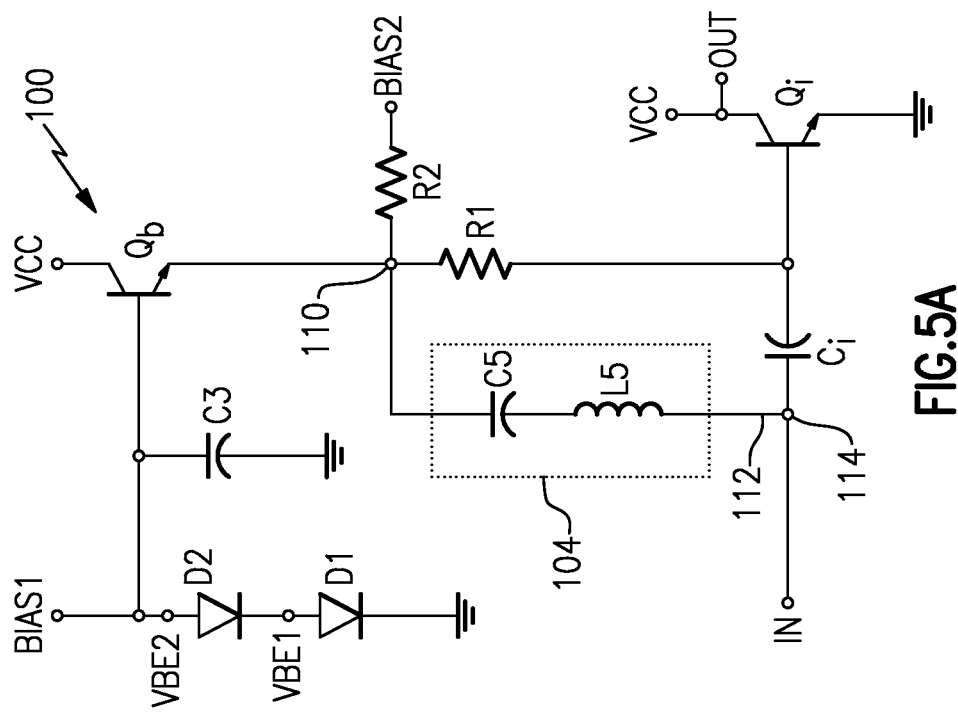

In example configurations 100 of FIGS. 5A and 5B, the linearizing circuit 104 can include a capacitance C5 (e.g., capacitor) connected in series with an inductance L5 along the path 112 that couples the nodes 110 and 114. In the example of FIG. 5A, the inductance L5 is between the capacitance C5 and the node 114. In the example of FIG. 5B, the order of L5 and C5 is reversed, so that the inductance L5 is between the capacitance C5 and the node 110.

Figure 6B:
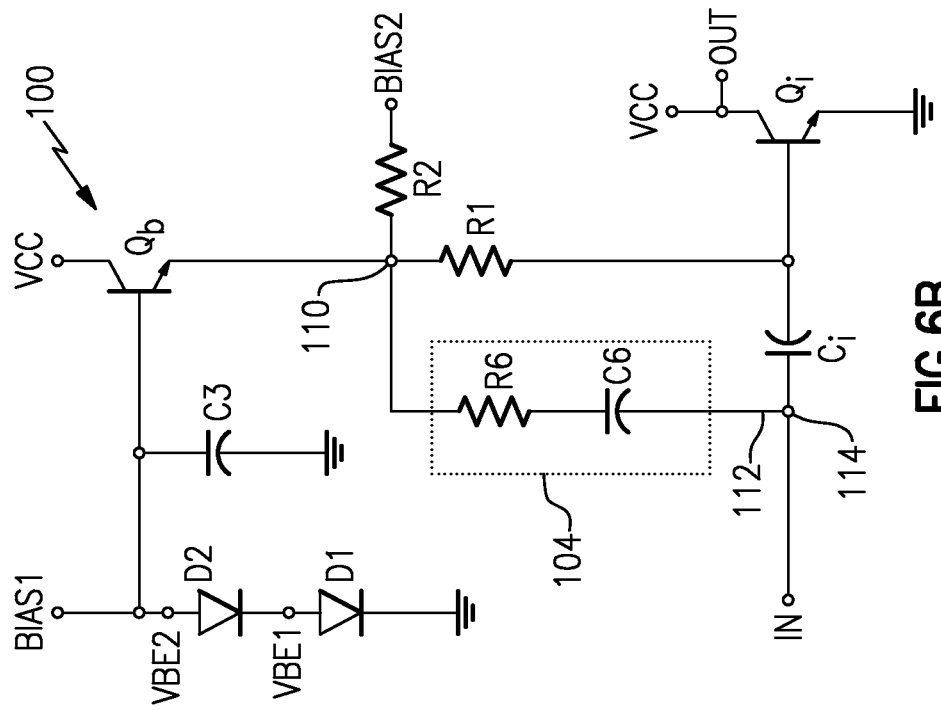
FIGS. 6A and 6B show yet more examples of the linearizing circuit.
Figure 6A:
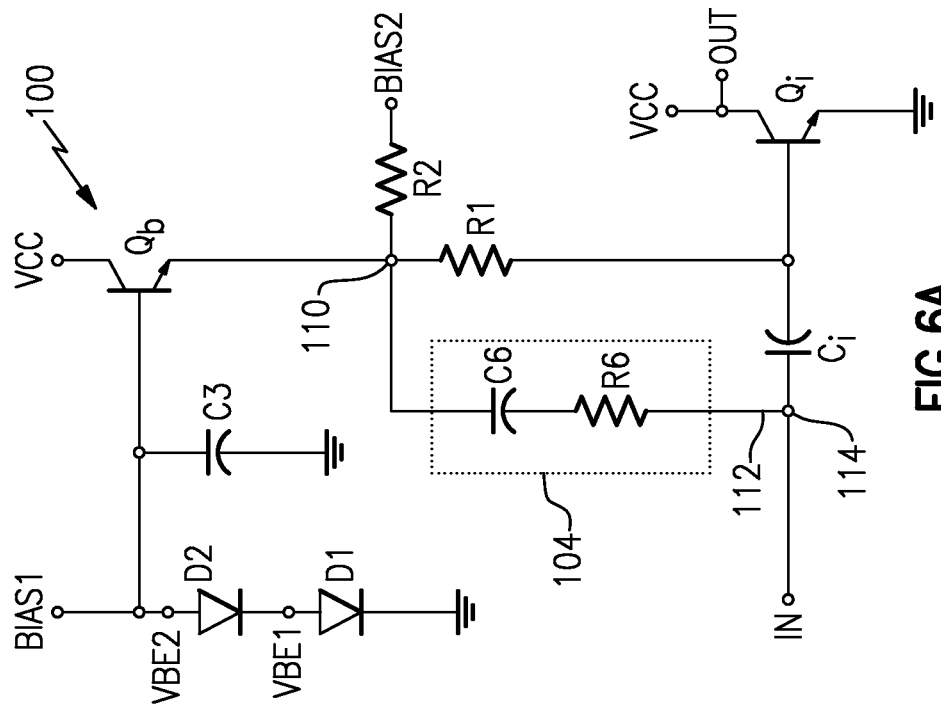

In example configurations 100 of FIGS. 6A and 6B, the linearizing circuit 104 can include a capacitance C6 (e.g., capacitor) connected in series with a resistance R6 (e.g., resistor) along the path 112 that couples the nodes 110 and 114. In the example of FIG. 6A, the resistance R6 is between the capacitance C6 and the node 114. In the example of FIG. 6B, the order of R6 and C6 is reversed, so that the resistance R6 is between the capacitance C6 and the node 110.

Figure 7:
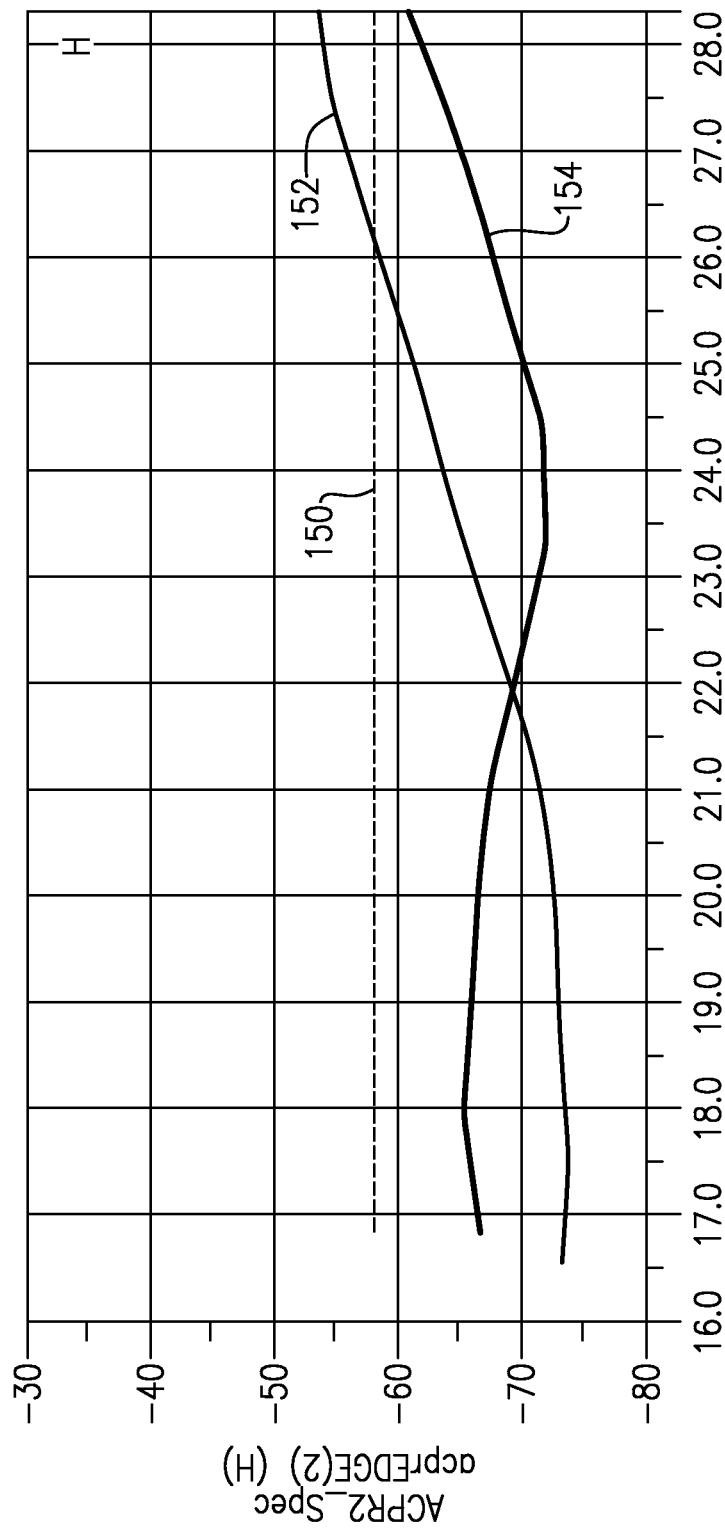
FIG. 7 shows an example of performance improvement that can be obtained by implementation of a linearizing circuit having one or more features as described herein.

FIG. 7 shows an example of improvement in linearity performance that can be obtained by use of a linearizing circuit as described herein. In FIG. 7, a horizontal dashed line 150 represents a specified value for an adjacent channel power ratio (ACPR) parameter in a range of power output gain of the PA 106 of FIG. 3. As is generally known, ACPR can represent linearity or non-linearity of a PA.

In FIG. 7, the curve indicated as 152 represents simulated ACPR as a function of output power of the PA 16 of FIG. 2 where linearizing circuit is not present. As one can see, the ACPR value exceeds the specified ACPR value 150 when the power output gain is greater than about 26.0 dBm. Hence, when the example PA's output gain is high, its non-linearity exceeds the specified value.

In FIG. 7, the curve indicated as 154 represents simulated ACPR as a function of output power of the PA 106 of FIG. 3 where linearizing circuit 104 is present. For the example curve 154, the linearizing circuit 104 includes a capacitance similar to C4 of FIG. 4. As one can see, the ACPR value remains well below the specified ACPR value 150 throughout the power output gain. For the example configuration of FIG. 3 that yields the ACPR curve 154 of FIG. 7, values of resistances and capacitances can be selected depending on particular designs.

Figure 8:
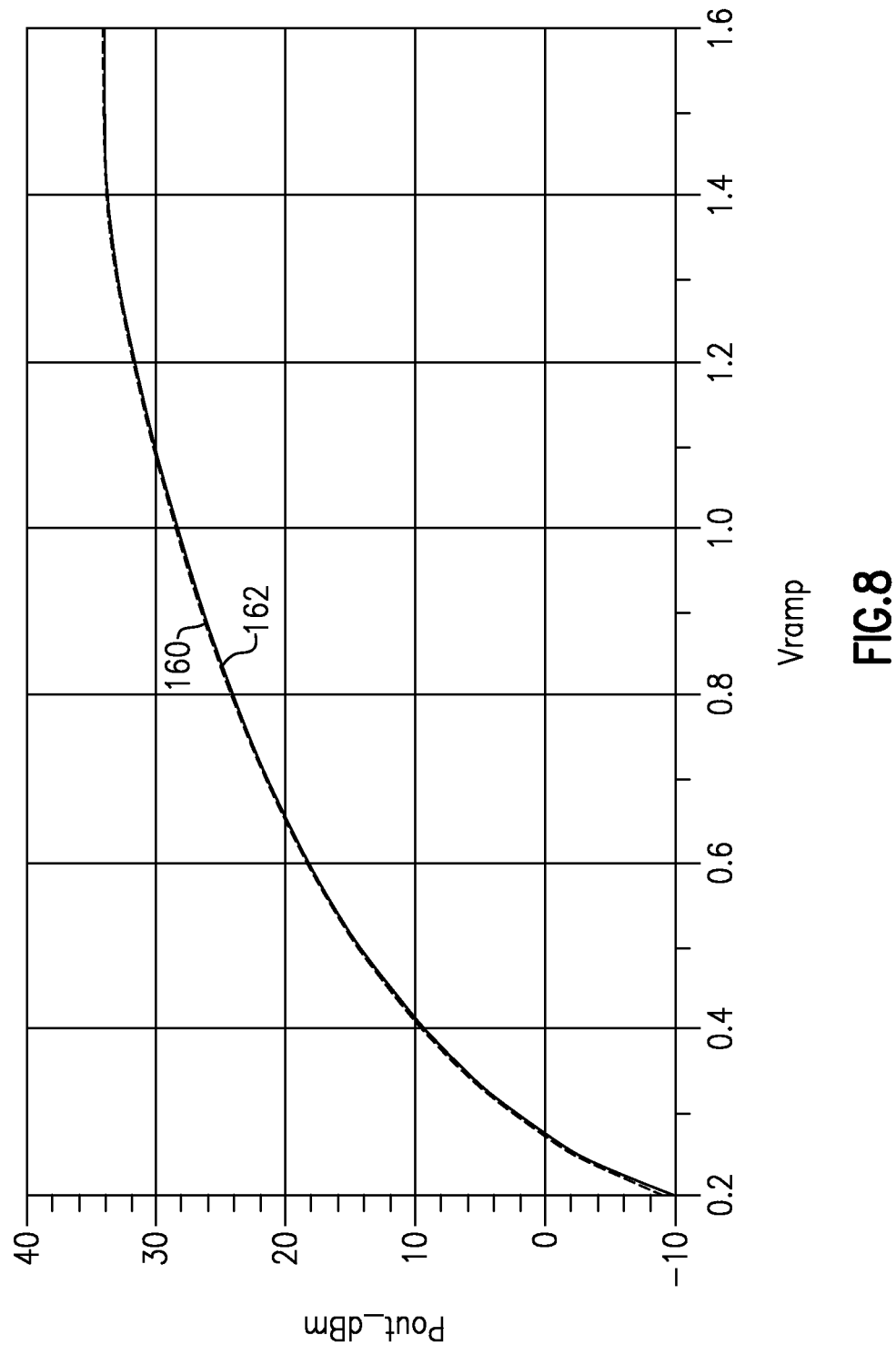
FIG. 8 shows an example where performance improvement such as the example of FIG. 7 can be obtained without significant degradation in performance of other parameters.

FIG. 8 shows by way of example that the foregoing improvement in linearity can be achieved without necessarily sacrificing performance of other operating parameters. In FIG. 8, power output gain is plotted as a function of power control voltage Vramp. Such a voltage can control, for example, the level of output power for GMSK modulation or optimize the performance of EDGE modulation. As shown in FIG. 8, the addition of the linearizing circuit (such as the example of FIG. 4) in FIG. 3 has little or no degrading effect on the Vramp dependence of the power output gain.

Figure 10:
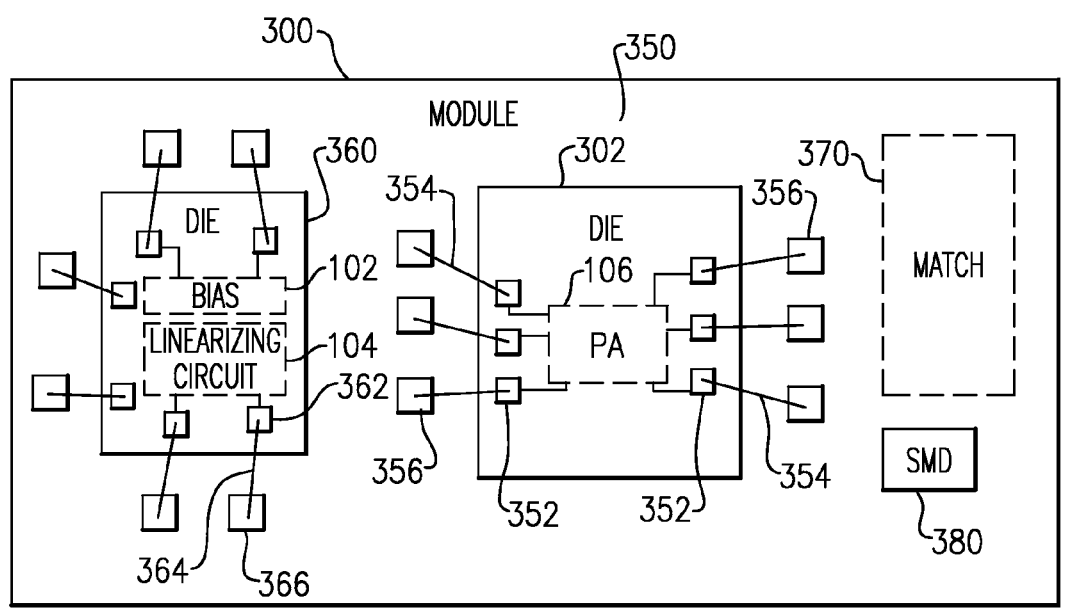
FIG. 10 shows that in some embodiments, a linearizing circuit having one or more features as described herein can be a part of a module.
Figure 11:
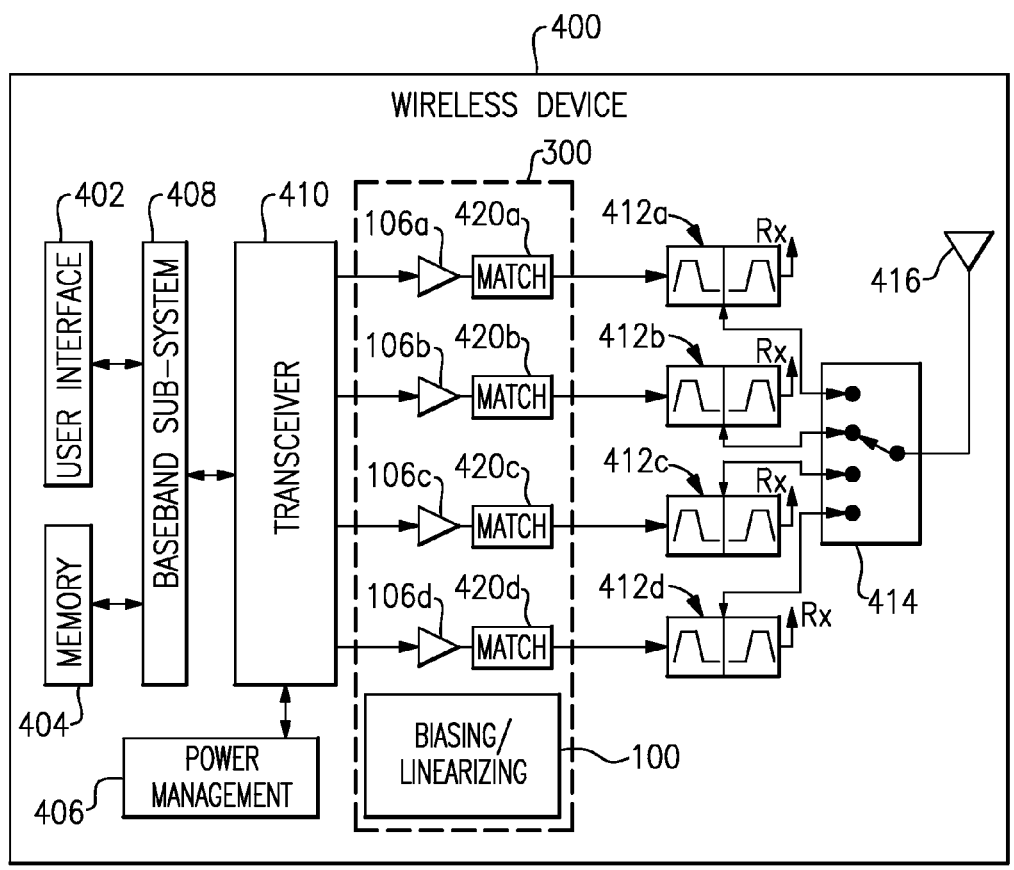
FIG. 11 shows that in some embodiments, a linearizing circuit having one or more features as described herein can be a part of a wireless device.

In some embodiments, a linearizing circuit having one or more features as described herein can be implemented in different products. FIGS. 9-11 show non-limiting examples of such products. FIGS. 9A-9E show various examples of how a linearizing circuit 104 can be implemented at a die level. FIG. 10 shows an example of how a linearizing circuit 104 can be implemented in a module such as a packaged module. FIG. 11 shows an example of how a linearizing circuit can be implemented in a wireless device.

Figure 9A:
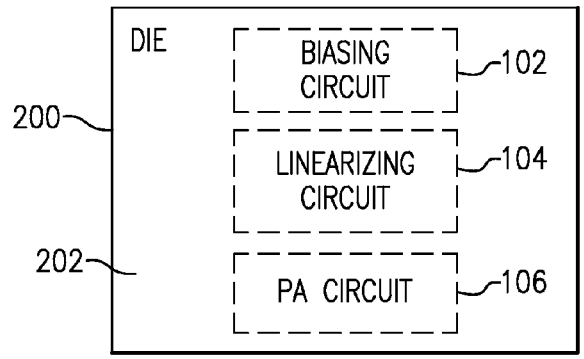
FIGS. 9A-9E show various non-limiting examples of how a linearizing circuit having one or more features as described herein can be implemented on or relative to one or more semiconductor die.

FIGS. 9A-9E show that a linearizing circuit 104 having one or more features as described herein can be implemented on one or more die. FIG. 9A shows that in some embodiments, a linearizing circuit 104 can be formed on a semiconductor substrate 202 of a die 200 that also includes a biasing circuit 102 and a PA circuit 106. Such a die can include, for example, an HBT die based on gallium arsenide (GaAs) substrate.

Figure 9B:
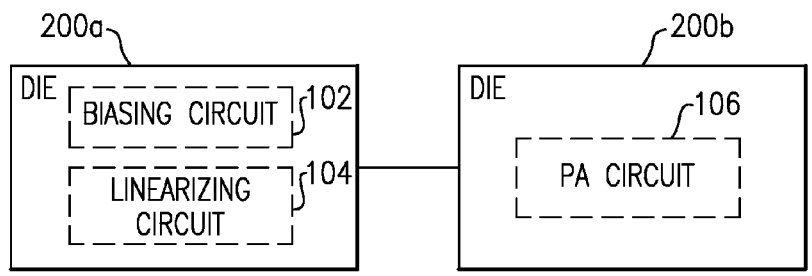
Figure 9C:
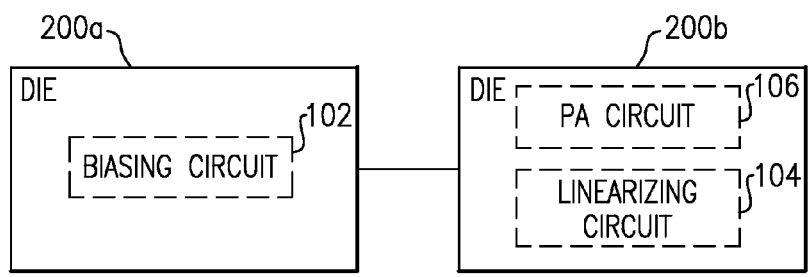
Figure 9D:
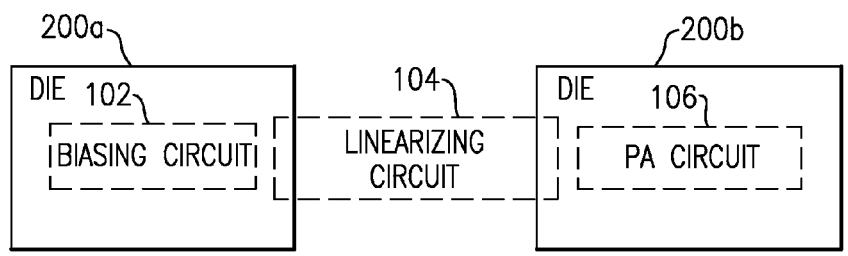
Figure 9E:
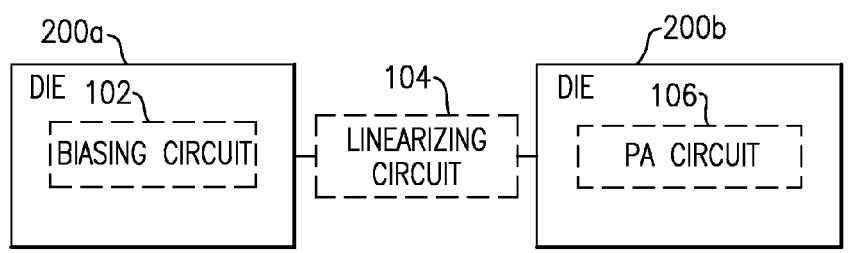

FIGS. 9B-9E show examples where a biasing circuit 102 can be implemented on a first die 200a, and a PA circuit 106 can be implemented on a second die 200b. FIG. 9B shows that in some embodiments, a linearizing circuit 104 having one or more features as described herein can be implemented on the first die 200a that includes the bias circuit 102. FIG. 9C shows that in some embodiments, a linearizing circuit 104 having one or more features as described herein can be implemented on the second die 200b that includes the PA circuit 106. FIG. 9D shows that in some embodiments, a linearizing circuit 104 having one or more features as described herein can be implemented partly on the first die 200a, partly on the second die 200b, and partly out of both die 200a, 200b. FIG. 9E shows that in some embodiments, a linearizing circuit 104 having one or more features as described herein can be implemented substantially out of both die 200a, 200b. Other configurations are also possible.

FIG. 10 schematically depicts an example module 300 that can be configured to include a linearizing circuit 104 having one or more features as described herein. In FIG. 10, the example module 300 is shown to include a PA die 302 that includes a PA circuit 106 (e.g., HBT PA circuit). In the example of FIG. 10, a biasing circuit 102 and a linearizing circuit 104 are depicted as being implemented on a separate die 360. However, it will be understood that the PA circuit 106, the biasing circuit 102, and the linearizing circuit 104 can be configured in other manners, such as the examples described in reference to FIGS. 9A-9E.

In the example module 300 of FIG. 10, the die 302 is shown to be mounted on a substrate 350. Such a die can be fabricated using a number of semiconductor process technologies, including the examples described herein. The die 302 can include a plurality of electrical contact pads 352 configured to allow formation of electrical connections 354 such as wirebonds between the die 302 and contact pads 356 formed on the packaging substrate 350.

In FIG. 10, the die 360 as described herein is shown to be mounted on the substrate 350. Such a die can be fabricated using a number of semiconductor process technologies, including the examples described herein. The die 360 can include a plurality of electrical contact pads 362 configured to allow formation of electrical connections 364 such as wirebonds between the die 360 and contact pads 366 formed on the packaging substrate 350.

The packaging substrate 350 can be configured to receive a plurality of components such as the die 302, 360 and one or more SMDs (e.g., 380). In some embodiments, the packaging substrate 350 can include a laminate substrate.

In the example packaged module 300, a matching circuit 370 can be implemented on and/or within the substrate 350. Such a matching circuit 370 can provide matching functionality for matching networks associated with the PA circuit 106.

In some embodiments, the module 300 can also include one or more packaging structures to, for example, provide protection and facilitate easier handling of the module 300. Such a packaging structure can include an overmold formed over the packaging substrate 350 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 11 schematically depicts an example wireless device 400 having one or more advantageous features described herein. In the example, one or more PAs 106 are shown to be biased by a PA biasing system 100 having one or more features as described herein. Such PAs and biasing system can facilitate, for example, multi-band operation of the wireless device 400. In embodiments where the PAs, biasing system, and matching circuits 420 are packaged into a module, such a module can be represented by a dashed box 300.

The PAs 106 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device 400, and/or to provide storage of information for the user.

In the example wireless device 400, outputs of the PAs 106 are shown to be matched (via match circuits 420) and routed to an antenna 416 via their respective duplexers 412a-412d and a band-selection switch 414. The band-selection switch 414 can be configured to allow selection of an operating band. In some embodiments, each duplexer 412 can allow transmit and receive operations to be performed simultaneously using a common antenna (e.g., 416). In FIG. 11, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power-amplifier (PA) comprising:
   a PA circuit that includes a bipolar junction transistor (BJT) having a base, a collector and an emitter, the BJT configured to receive a radio-frequency (RF) signal through an input path and amplify the RF signal, the input path including a capacitance implemented between an input node and the base of the BJT;
   a biasing circuit in communication with the PA circuit, the biasing circuit configured to provide a first bias signal or a second bias signal to the base of the BJT for operation in a first mode or a second mode, respectively, each of the first bias signal and the second bias signal routed to the BJT through a path that includes a common node and a ballast; and
   a linearizing circuit implemented between the common node and the input node of the input path, the linearizing circuit configured to provide a coupling path between the common node and the input path to improve linearity of the PA circuit operating in at least one of the first mode and the second mode.

2. The PA of claim 1 wherein the ballast includes a DC ballasting resistance.

3. The PA of claim 1 wherein the BJT includes a heterojunction bipolar transistor (HBT).

4. The PA of claim 1 wherein the linearizing circuit providing the coupling path between the common node and the input path improves linearity of the PA circuit operating in the first mode while allowing the ballast to be sufficiently robust for the PA circuit operating in the second mode.

5. A power-amplifier (PA) comprising:
   a PA circuit that includes a bipolar junction transistor (BJT) having a base, a collector and an emitter, the BJT configured to receive a radio-frequency (RF) signal at the base through an input path and amplify the RF signal, the amplified RF signal being output through the collector;

a biasing circuit in communication with the PA circuit, the biasing circuit configured to provide a first bias signal or a second bias signal to the PA circuit for operation in a first mode or a second mode, respectively, each of the first bias signal and the second bias signal routed to the BJT through a path that includes a common node and a ballast; and a linearizing circuit implemented between the common node and a node along the input path, the linearizing circuit configured to provide a coupling path between the common node and the input path to improve linearity of the PA circuit operating in the first mode while allowing the ballast to be sufficiently robust for the PA circuit operating in the second mode, the first mode including an EDGE (enhanced data rates for GSM evolution) mode, and the second mode including a GPRS (general packet radio service) mode.

6. The PA of claim 5 wherein the biasing circuit includes a current mirror that generates the first bias signal for the operation of the PA circuit in the EDGE mode.

7. The PA of claim 6 wherein the current mirror includes a BJT coupled to a reference current source, the first bias signal being output through an emitter of the BJT to be provided to the common node.

8. The PA of claim 7 wherein the ballast is implemented between the common node and the base of the PA BJT, such that the common node functions as a base-emitter junction between the base of the PA BJT and the emitter of the current mirror BJT.

9. The PA of claim 8 wherein the input path includes a DC blocking capacitance implemented between the base of the PA BJT and a node where the linearizing circuit is connected to.

10. The PA of claim 9 wherein the linearizing circuit is configured to couple the RF signal between the input path and the base-emitter junction to provide rectification on the base-emitter junction and correct AM-AM distortion and thereby yield the improved linearity.

11. The PA of claim 5 wherein the biasing circuit includes a bias resistance implemented between a GPRS bias node and the common node, such that the second bias signal is provided to the gate of the BJT from the GPRS bias node through the bias resistance, the common node, and the ballast.

12. The PA of claim 1 wherein the PA circuit includes a second BJT configured to provide another stage of amplification.

13. The PA of claim 12 wherein the second BJT is implemented so that the input path of the BJT is coupled to an output of the second BJT.

14. The PA of claim 12 wherein the BJT is configured to receive the RF signal from the second BJT.

15. The PA of claim 1 wherein the linearizing circuit includes a capacitance.

16. The PA of claim 1 wherein the capacitance of the input path is configured as a DC block capacitance.

17. A power-amplifier (PA) comprising:

a PA circuit that includes a bipolar junction transistor (BJT) having a base, a collector and an emitter, the BJT configured to receive a radio-frequency (RF) signal through an input path and amplify the RF signal;

a biasing circuit in communication with the PA circuit, the biasing circuit configured to provide a first bias signal or a second bias signal to the PA circuit for operation in a first mode or a second mode, respectively, each of the first bias signal and the second bias signal routed to the BJT through a path that includes a common node and a ballast; and a linearizing circuit implemented between the common node and a node along the input path, the linearizing circuit configured to provide a coupling path between the common node and the input path to improve linearity of the PA circuit operating in the first mode while allowing the ballast to be sufficiently robust for the PA circuit operating in the second mode, the linearizing circuit including a series arrangement of a capacitance and a resistance.

18. A power-amplifier (PA) comprising:

a PA circuit that includes a bipolar junction transistor (BJT) having a base, a collector and an emitter, the BJT configured to receive a radio-frequency (RF) signal through an input path and amplify the RF signal;

a biasing circuit in communication with the PA circuit, the biasing circuit configured to provide a first bias signal or a second bias signal to the PA circuit for operation in a first mode or a second mode, respectively, each of the first bias signal and the second bias signal routed to the BJT through a path that includes a common node and a ballast; and a linearizing circuit implemented between the common node and a node along the input path, the linearizing circuit configured to provide a coupling path between the common node and the input path to improve linearity of the PA circuit operating in the first mode while allowing the ballast to be sufficiently robust for the PA circuit operating in the second mode, the linearizing circuit including a series arrangement of a capacitance and an inductance.

19. A power-amplifier (PA) module comprising:

a packaging substrate configured to receive a plurality of components;

a power amplifier (PA) circuit formed on a die that is mounted on the packaging substrate, the PA circuit including a bipolar junction transistor (BJT) having a base, a collector and an emitter, the BJT configured to receive a radio-frequency (RF) signal through an input path and amplify the RF signal, the input path including a capacitance implemented between an input node and the base of the BJT;

a biasing circuit in communication with the PA circuit, the biasing circuit configured to provide a first bias signal or a second bias signal to the base of the BJT for operation in a first mode or a second mode, respectively, each of the first bias signal and the second bias signal routed to the BJT through a path that includes a common node and a ballast; and a linearizing circuit implemented between the common node and the input node of the input path, the linearizing circuit configured to provide a coupling path between the common node and the input path to improve linearity of the PA circuit operating in at least one of the first mode and the second mode.

20. A method for operating a power-amplifier (PA), the method comprising:

receiving a radio-frequency (RF) signal through an input path in a PA circuit that includes a bipolar junction transistor (BJT) having a base, a collector and an emitter, the input path including a capacitance implemented between an input node and the base of the BJT;

providing a first bias signal or a second bias signal to the base of the BJT for operation in a first mode or a second mode, respectively, each of the first bias signal and the second bias signal routed to the BJT through a path that includes a common node and a ballast; and coupling the common node and the input node of the input path with a linearizing circuit to improve linearity of the PA circuit operating in at least one of the first mode and the second mode.

* * * * *